United States Patent [19]

Zambrano et al.

[11] Patent Number: 5,246,871

[45] Date of Patent: Sep. 21, 1993

[54] METHOD OF MANUFACTURING A SEMICONDUCTOR DEVICE COMPRISING A CONTROL CIRCUIT AND A POWER STAGE WITH A VERTICAL CURRENT FLOW, INTEGRATED IN MONOLITHIC FORM ON A SINGLE CHIP

[75] Inventors: Raffaele Zambrano, Mercato San Severino; Salvatore Musumeci, Riposto Ct; Salvatore Raciti, Belpasso Ct, all of Italy

[73] Assignee: SGS-THOMSON Microelectronics S.r.L., Agrate Brianza, Italy

[21] Appl. No.: 805,048

[22] Filed: Dec. 11, 1991

Related U.S. Application Data

[62] Division of Ser. No. 537,940, Jun. 14, 1990, Pat. No. 5,119,167.

[30] Foreign Application Priority Data

Jun. 16, 1989 [IT] Italy .................................. 6610 A89

[51] Int. Cl.⁵ ........................................... H01L 21/70

[52] U.S. Cl. ....................................... 437/51; 437/59; 437/74; 437/76; 437/77; 148/DIG. 126

[58] Field of Search .................... 437/51, 74, 76, 59, 437/97, 61, 51; 148/DIG. 126

[56] References Cited

U.S. PATENT DOCUMENTS

| | | | |
|---|---|---|---|
| 4,311,532 | 1/1982 | Taylor | 437/59 |
| 4,667,393 | 5/1987 | Ferla et al. | 437/54 |
| 4,721,684 | 1/1988 | Musumeci | 437/51 |
| 4,780,430 | 10/1988 | Musumeci et al. | 437/51 |
| 4,814,288 | 3/1989 | Kimura et al. | 437/59 |
| 4,889,822 | 12/1989 | Musumeci et al. | 437/51 |
| 4,914,051 | 4/1990 | Huie et al. | 437/59 |
| 4,916,085 | 4/1990 | Frisina | 437/59 |
| 4,965,215 | 10/1990 | Zambrano et al. | 437/51 |

Primary Examiner—Brian E. Hearn
Assistant Examiner—Tuan Nguyen
Attorney, Agent, or Firm—Wenderoth, Lind & Ponack

[57] ABSTRACT

The problems normally linked to the creation of a power stage using BJT transistors are overcome realizing the power stage with BMFET transistors.

3 Claims, 4 Drawing Sheets

METHOD OF MANUFACTURING A SEMICONDUCTOR DEVICE COMPRISING A CONTROL CIRCUIT AND A POWER STAGE WITH A VERTICAL CURRENT FLOW, INTEGRATED IN MONOLITHIC FORM ON A SINGLE CHIP

This application is a divisional of allowed application Ser. No. 07/537,940, filed Jun. 14, 1990, now U.S. Pat. No. 5,119,161.

BACKGROUND OF THE INVENTION

The present invention relates to a semiconductor device comprising a control circuit and a power stage with a vertical current flow, integrated in monolithic form in a single chip. The association on the same chip of a power stage realized with bipolar transistors (BJT) and the related control circuit, creates a very compact, efficient device, which has the following advantages over separate components:

the reliability and the efficiency of the device increases as it is possible to insert a series of dedicated controls (e.g. "thermal shutdown", to switch-off the power stage when a certain maximum temperature is reached, "SOA" protection against direct secondary breakdowns, etc.), which, inasmuch as they are included on the same chip, are much more efficient than an external control;

the cost of the system using a similar device is lower, as a single package is used instead of two (or more) packages; this not only reduces the space and the weight of the system, but also increases overall reliability.

On the other hand the use of BJT-type power stages makes it more difficult to solve other problems, such as, basically, the low switching speed, the maximum current density, the extension of the Reverse Bias Safe Operating Area (RBSOA). It is however a known fact that the use of power stages of the MOS type is only advisable for devices which can operate at low voltages, due to the problems connected to excessive series drain resistance (Ron).

SUMMARY OF THE INVENTION

The object of the present invention is to develop an integrated monolithic semiconductor device which, while maintaining the advantages indicated above makes it possible to overcome the problems connected with the use of BJT and MOS power stages.

This object is effected by forming the power stage with BMFET transistors (Bipolar Mode Field Effect Transistors)..

This choice makes it possible to maximize the current handling, the ruggedness and the dynamic performances of the power stage. It also offers the following additional advantages:

higher switching speed, and, as a result, lower power losses;

higher current density, and therefore reduced area of the device;

greater extension of the RBSOA area, and, as a result, reduced complexity of the driving circuit, as it is no longer necessary to protect the power stage while switching off inductive loads;

easier an design of the power stage, on account of the modular structure of the BMFET transistor (in fact, since the BMFET transistor is made up of a plurality of identical elementary cells, a certain operating current is ensured simply by parallel connecting the required number of elementary cells).

BRIEF DESCRIPTION OF THE DRAWINGS

The features of the present invention may be better understood by the following description and the enclosed drawings, illustrating an example of non-restrictive value, in which the various figures show.

DESCRIPTION OF THE PREFERRED EMBODIMENT

Figure 1:
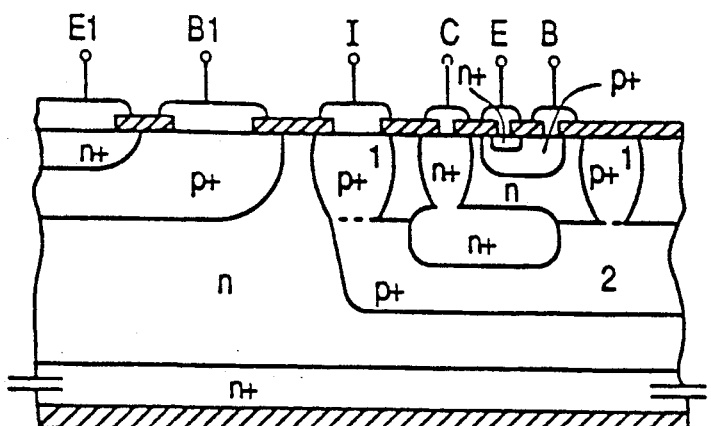
FIG. 1 a structure of a known device.

FIG. 1 illustrates the known structure of a semiconductor device comprising a control circuit and a power stage with a vertical current flow, integrated in monolithic form on a single chip. For the sake of simplicity only one NPN transistor of the integrated control circuit (with emitter terminal=E, base terminal=B and collector=C), and one bipolar power transistor (with emitter terminal=E1, base terminal=B1 and collector=C1), have been indicated.

Regions 1 and 2 together constitute the isolation region of the NPN low voltage transistor which, for the correct operation of the device, is connected, via terminal I, to the point of lowest potential of the device itself.

Figure 2:
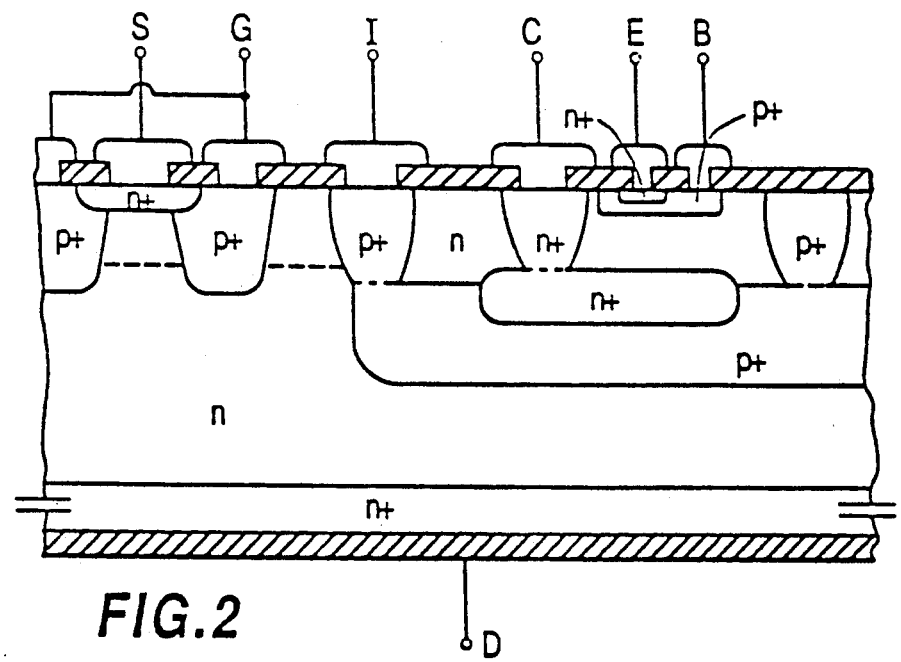
FIG. 2 a structure of a similar device according to the present invention.

FIG. 2 illustrates the structure of a similar device according to the present invention. This structure differs from FIG. 1 in that the BJT power transistor is replaced by a BMFET transistor (with source terminal=S, gate terminal=G and drain terminal=D). The manufacturing process can be described as follows.

Figure 3:
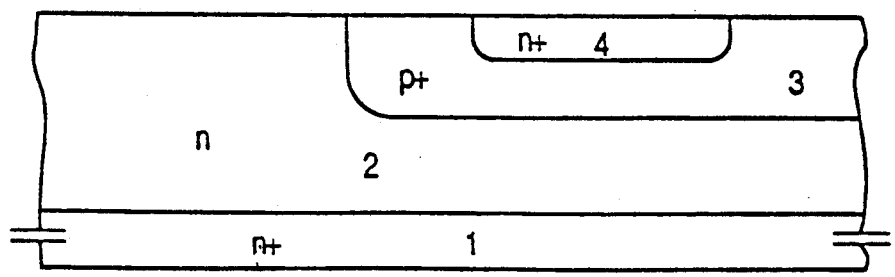
FIGS. 3, 4, 5, 6 a first example of a manufacturing process of the device in FIG. 2.

An n type epitaxial layer 2 is grown on an n+ type substrate 1 of monocrystalline silicon with a high concentration of impurities (FIG. 3).

Using the usual techniques of oxidation, photomasking, implantation and diffusion, a p+ type region 3 is formed, to constitute the horizontal isolation region of the components of the integrated control circuit and, within it, an n+ type region 4 is formed, destined to serve as buried collector layer of a transistor of the integrated control circuit.

Figure 4:
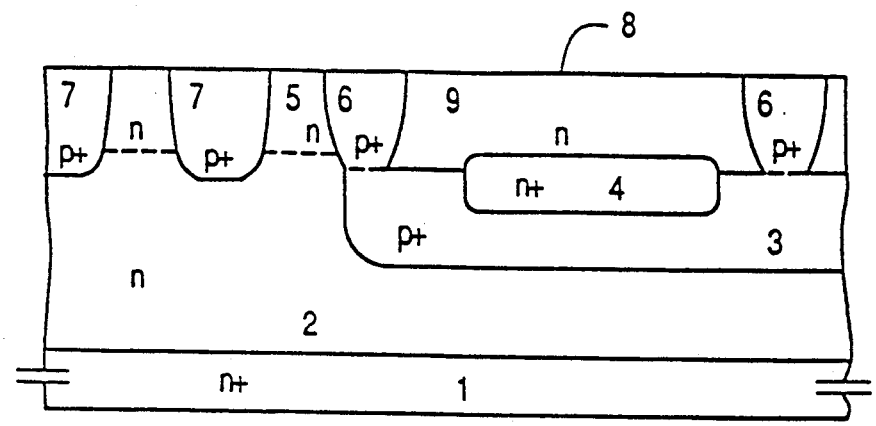

At this point (FIG. 4) a new n type epitaxial layer 5 is grown, extending over the whole area of the chip. Using the well known techniques of oxidation, photomasking, implantation and diffusion, p+ type regions 6 and 7 are formed. FIG. 4 shows how regions 6 extend from surface 8 to reach region 3 and to enclose an n type region 9, within which the NPN low voltage transistor will later be created, while regions 7 are destined to be used as the gate of the BMFET transistor.

Figure 5:
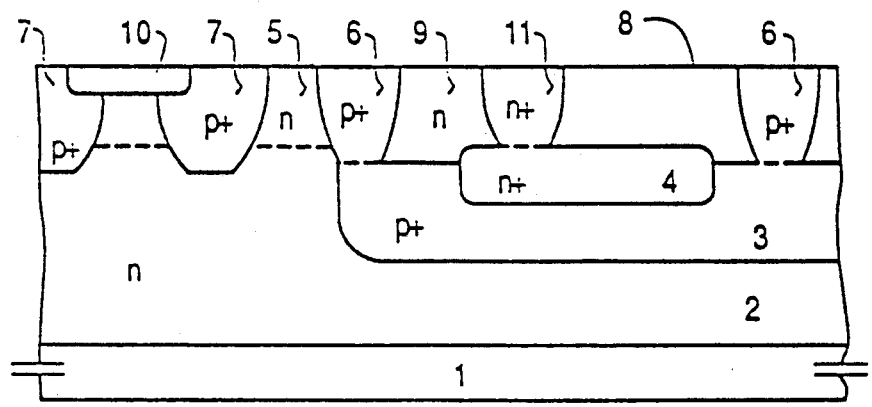

At this point (FIG. 5) regions 10 and 11, of n+ type, are formed, to be used, respectively, as the source of the BMFET transistor and as collector sink, which reduces the series resistance of the collector of the low voltage transistor.

With well known techniques (FIG. 6) the base region 12 and the emitter region 13 of the NPN low voltage transistor are formed, contacts are realized and the various elements of the device are interconnected by a process of metallization and photomasking. All the terminal electrodes of the various components are thus located on the front of the chip, except for the drain of the BMFET transistor which is on the back.

Figure 7:
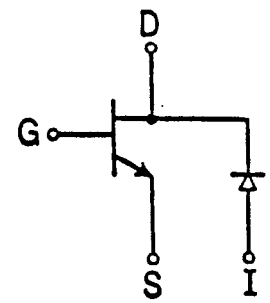
FIG. 7 an electrical equivalent of the present structure in FIG. 6.
Figure 6:
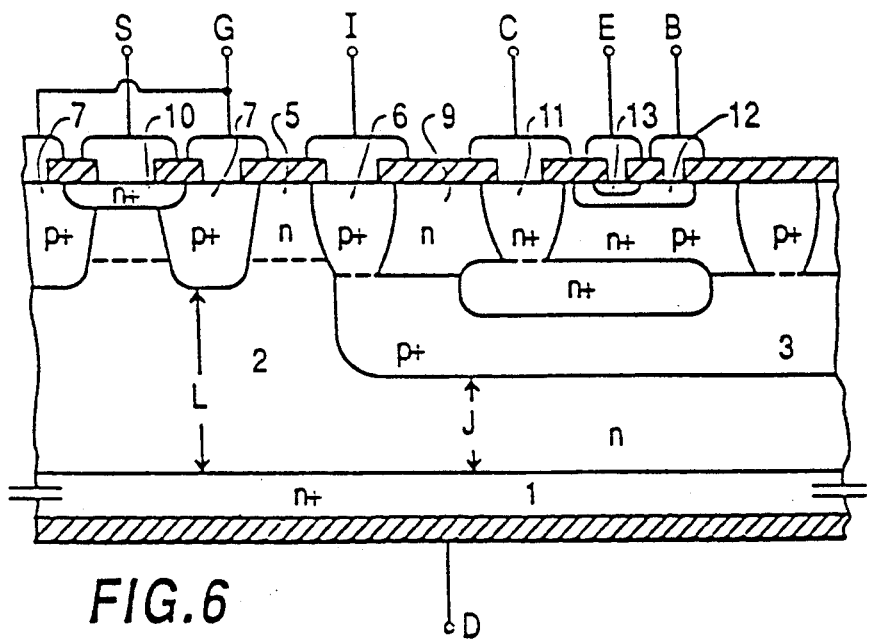
Figure 8:
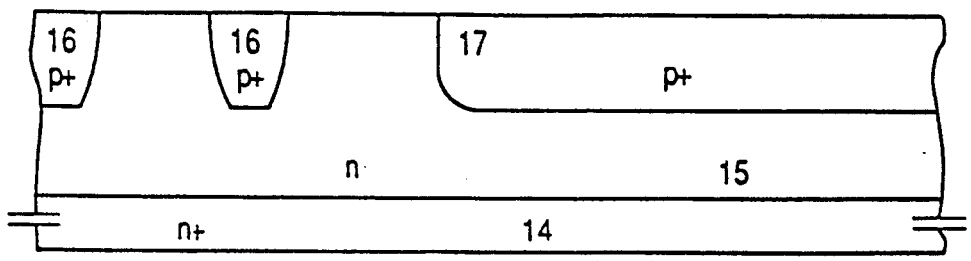
FIGS. 8, 9, 10, 11, 12 second example of a manufacturing process of a device according to the present invention.
Figure 9:
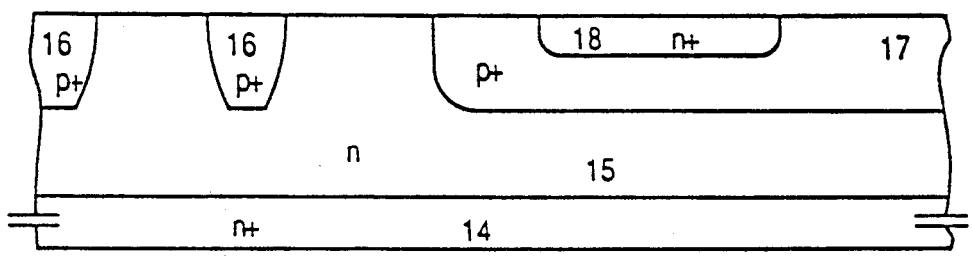
Figure 10:
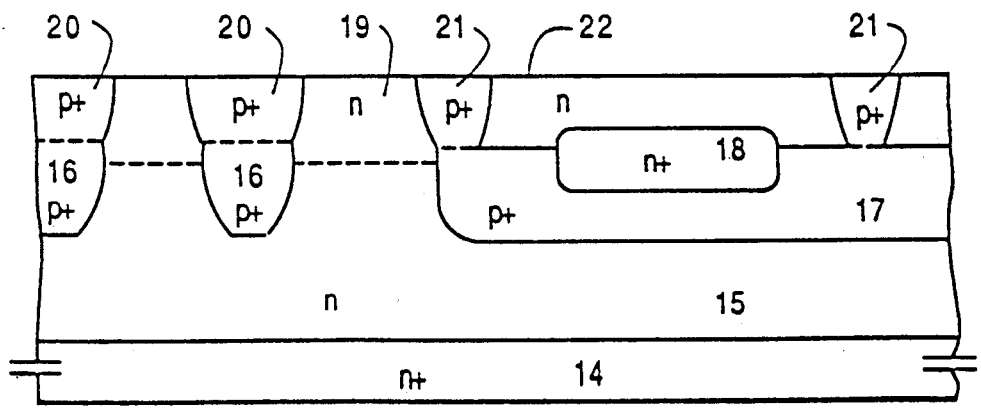
Figure 11:
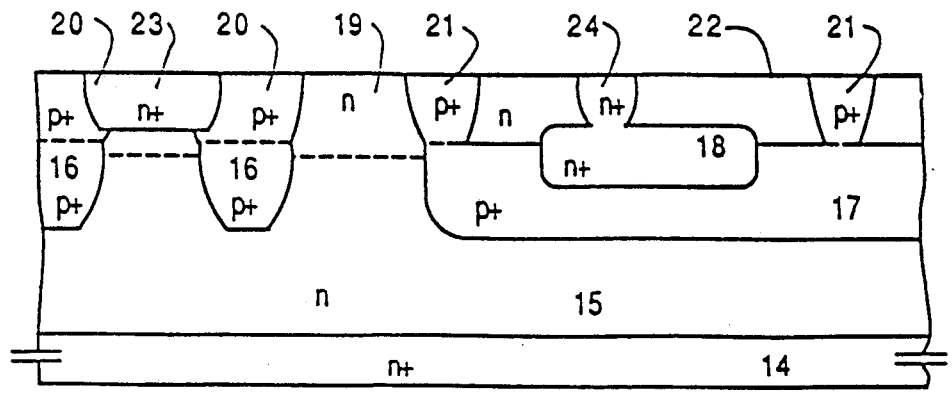

FIG. 7 illustrates the electrical equivalent of the structure of FIG. 6 relating to the BMFET. It shows that the diode, whose anode is the isolation region, and whose cathode is the drain of the BMFET transistor, is reverse biased if terminal I is connected to the point of lowest potential among those present on the circuit; the components of the integrated control circuit are therefore isolated from each other and from the power stage.

In FIG. 6 it is clear that distance J between the lower edge of the isolation region and the substrate is lower than distance L between the lower edge of the gate region of the BMFET transistor and the substrate: as a result the breakdown voltage of the diode mentioned above is lower than the breakdown voltage of the BMFET transistor, and therefore the maximum operating voltage of the monolithic device corresponds to the first of these two breakdown voltages. It is therefore necessary, at the design stage, to establish the thickness J so that it can withstand the maximum required voltage. Since the current gain of the BMFET depends on the drain thickness, or L, according to a law of inverse quadratic proportionality, and since $L > J$, it can be seen that this gain is penalized by the different junction depth of the BMFET gate compared to that of the horizontal isolation region 3.

It is therefore advantageous to devise a process which will make it possible to achieve $L = J$, as this will bring the current handling capability to a maximum, maintaining unchanged the device operating voltage. This equality is made possible by creating the BMFET gate region and the horizontal isolation region before the second epitaxial growth, using the same process of diffusion.

An example of a process suitable to achieve this purpose is illustrated in FIGS. 8, 9, 10, 11 and 12.

This process includes the following stages in sequence:
- a first n type epitaxial layer 15 is grown on a substrate 14 of n+ type monocrystalline silicon with a high concentration of impurities;
- with the usual techniques of oxidation, photomasking, implantation and diffusion, regions 16 and 17 of p+ type are formed within layer 15, destined to constitute respectively the BMFET gate region and the horizontal isolation region of the integrated control circuit components;
- an n+ type region 18 is formed within region 17, in order to provide the buried collector layer of the transistor of the integrated control circuit;
- a second n type epitaxial layer 19 is grown extending over the whole area of the chip;
- using known techniques of oxidation, photomasking and implantation of the second epitaxial layer and successive diffusion, regions 20 and 21 of p+ type are formed; regions 20 are immediately above regions 16 and join them, regions 21 extend from surface 22 up to reach region 17;
- two n+ type regions 23 and 24 are formed; region 23, constituting the source of the BMFET, is localised between two adjacent regions 20 inside which it extends, while region 24, constituting the collector sink, is placed above region 18 and joins it;
- using well known techniques the base region 25 and the emitter region 26 of the NPN low voltage transistor are made, the contacts are realized and the various elements of the device are interconnected by means of metallization and photomasking process.

Figure 12:
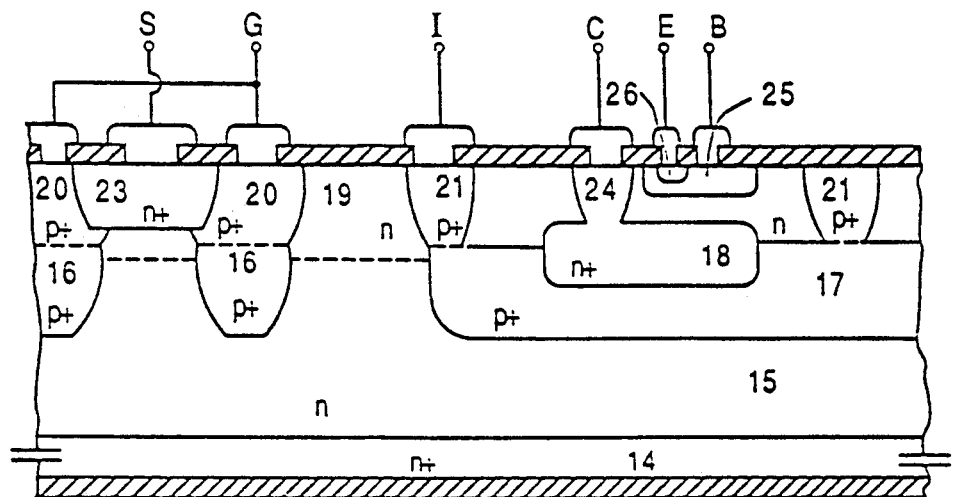

FIG. 12 shows that the gate of the BMFET and the horizontal isolation region have the same junction depth.

The embodiment of the process illustrated in FIGS. 8-12 offers two further advantages: the length of the channel (and therefore the blocking gain of the BMFET transistor) is increased, and it is also possible to set the doping concentration the first and second epitaxial layers independently, as the channel extends mainly in the first epitaxial layer, while the region of the epitaxial collector of the transistor of the control circuit is situated inside the second epitaxial layer: the doping levels of these two layers can, as a consequence, also be determined independently of each other.

It is clear that the examples of realization described above can be modified, adapted or integrated, without going outside the scope of the present invention.

Figure 13:
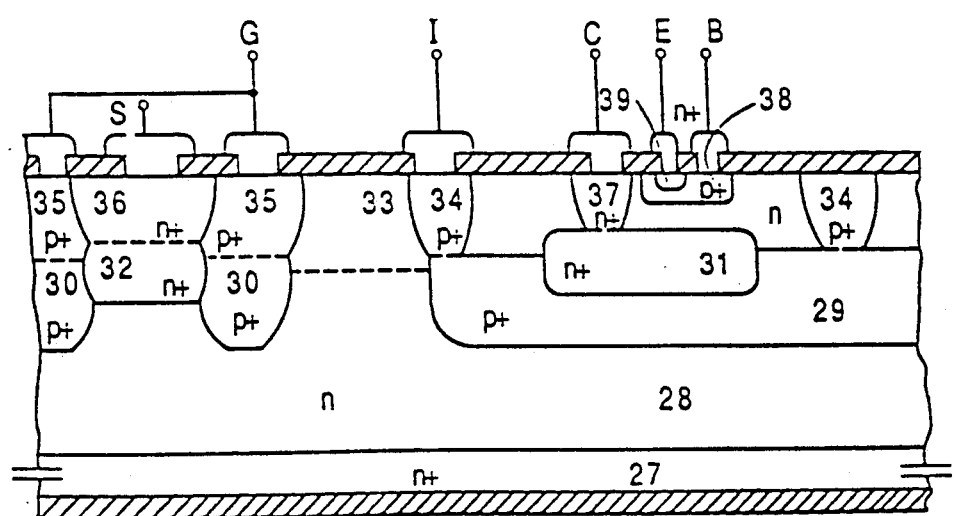
FIG. 13 a final structure of a device obtained with a variation to the process illustrated in FIGS. 8-12.

FIG. 13 illustrates one possible embodiment. It regards the source region of the BMFET which could be made up of two regions 32 and 36 in series, if one wished to place a greater priority on the lower series drain resistance, instead of the blocking gain.

The relative manufacturing process foresees the following stages in sequence:
- a first n type epitaxial layer is grown on a n+ type substrate 27 of monocrystalline silicon, with a high concentration of impurities;
- using the usual techniques of oxidation, photomasking implantation and diffusion, p+ type regions 30 and 29 are formed within layer 28, to constitute respectively the gate region of the BMFET and the horizontal isolation region of the components of the integrated control circuit;
- an n+ type region 31 is formed within region 29, to constitute the buried collector layer of the transistor of the integrated control circuit, and an n+ type region 32 (intended to be the source of the BMFET) situated between two regions 30, inside which it extends;
- a second n type epitaxial layer 33 is grown, extending over the whole area of the chip;
- using known techniques of oxidation, photomasking and implantation of the second epitaxial layer and successive diffusion, p+ type regions 35 and 34 are made; regions 35 are located immediately above regions 30 and join them, regions 34 extend from the upper surface of the second epitaxial layer down to region 29;
- two n+ type regions 36 and 37 are formed; region 36 is located immediately above region 32 and joins it, while region 37 constitutes the collector sinker, is placed above region 31 and joins it;
- using well known techniques the base region 38 and the emitter 39 of the NPN low voltage transistor are formed, the contacts are opened and the various elements of the device are interconnected using a process of metallization and photomasking.

According to another possible variation, the epitaxial region 5 in FIG. 6 could be formed by a double growth, or in such a way as to present a variable resistance.

Another variation could be a double level of metallization.

This double level of metallization would be particularly advisable for the structure according to present invention, as it would permit a sensible reduction of space both for the power stage and for the control system. In fact for the metallization paths which collect the gate and source current of the BMFET, space could be saved which could be used to produce other elementary cells. In the same way it is possible to achieve higher component density in the region occupied by the control circuit.

We claim:

1. A method of manufacturing a semiconductor device comprising a power stage with vertical current flow, containing at least one BMFET transistor, and a control circuit, integrated in monolithic form in a single chip, comprising the following steps:

growing a first n type epitaxial layer on a heavily doped n+ type substrate of monocrystalline silicon;

forming a first p+ type epitaxial layer on a heavily doped n+ type substrate of monocrystalline silicon;

forming a first p+ type region inside said first n type epitaxial layer, to constitute a horizontal isolation region of the integrated control circuit components;

forming a first n+ type region inside said first p+ type region, to provide a buried collector layer of a transistor of the integrated control circuit;

growing a second n type epitaxial layer, extending over the whole area of the chip;

forming second and third p+ type regions inside the second epitaxial layer, using oxidation, photomasking, implantation and subsequent diffusion techniques, said second p+ type region constituting the gate of the BMFET transistor, and said third p+ type region extending from the surface of the second epitaxial layer inside said second epitaxial layer to join said first p+ type region;

forming two second n+ type regions, one of said two second n+ type regions constituting the source of the BMFET transistor, extending between two adjacent regions of said third p+ type regions, and the other of said two second n+ type regions constituting the collector sinker, being positioned above said first n+ type region and joining it;

forming, above said first n+ type region, a base region and an emitter region of an NPN low voltage transistor, defining the contact areas of the semiconductor device by means of photomasking and etching techniques, and providing interconnection tracks among the components of the device by means of metallization and patterning techniques.

2. A method of manufacturing a semiconductor device comprising a power stage with vertical current flow, containing at least one BMFET transistor, and a control circuit, integrated in monolithic form in a single chip comprising the following steps:

forming first and second p+ type regions inside said first n type layer, to respectively constitute a gate region of the BMFET and a horizontal isolation region of the integrated control circuit components;

growing a first n type epitaxial layer on a heavily doped n+ type substrate of monocrystalline silicon;

forming a first n+ type region inside said second p+ type region to provide a buried collector layer of a transistor of the integrated control circuit;

growing a second n type epitaxial layer, extending over the whole area of the chip;

forming first and second p+ type regions inside the second epitaxial layer, using oxidation, photomasking, implantation and subsequent diffusion techniques the first additional p+ type region being positioned immediately over the first p+ type region and joining them, and the second additional p+ type region extending from the surface of the second n type epitaxial layer inside said second epitaxial layer to join the second p+ type region;

forming two second n+ type regions, one of said two second n+ type regions constituting a source of the BMFET transistor, and being located between two adjacent regions of said first additional p+ type regions inside which it extends, and the other of said two second n+ type regions constituting the collector sinker, and being positioned above said first n+ type region and joining it;

forming above said first n+ type region, a base region and an emitter region of an NPN low voltage transistor, defining the contact areas of the semiconductor device by means of photomasking and etching techniques, and providing interconnection tracks among the components of the device by means of metallization and patterning techniques.

3. A method of manufacturing a semiconductor device comprising a power stage with vertical current flow, containing at least one BMFET transistor, and a control circuit, integrated in monolithic form in a single chip, comprising the following steps:

growing a first n type epitaxial layer on a heavily doped n+ type substrate of monocrystalline silicon;

forming first and second p+ type regions inside the n type first epitaxial layer to respectively constitute a gate region of the BMFET and a horizontal isolation region of the integrated control circuit components;

forming first and second n+ type regions inside said second p+ type region to respectively provide a buried collector layer of a transistor of the integrated control circuit and a source region of the BMFET, the second n+ type region being located between two of said first p+ type regions which it joins;

growing a second n type epitaxial layer, extending over the whole area of the chip;

forming first and second additional p+ type regions inside the second epitaxial layer, using oxidation, photomasking, implantation and subsequent diffusion techniques, the second p+ type additional region being positioned immediately over the first p+ type regions and joining them, and the second p+ type additional region extending from the surface of the second n type epitaxial layer inside said second epitaxial layer to join the second p+ type region;

forming two additional n+ type regions, one of said two additional regions being located immediately above the second n+ type region and joining it, and the other of said two additional regions constituting the collector sinker, and being positioned above the first n+ type region and joining it;

forming above said first n+ type region, a base region and an emitter region of an NPN low voltage transistor, defining the contact areas of the semiconductor device by means of photomasking and etching techniques, and providing interconnection tracks among the components of the device by means of metallization and patterning techniques.

* * * * *

UNITED STATES PATENT AND TRADEMARK OFFICE
CERTIFICATE OF CORRECTION

PATENT NO. : 5,246,871

DATED : September 21, 1993

INVENTOR(S) : Raffaele ZAMBRANO et al.

It is certified that error appears in the above-identified patent and that said Letters Patent is hereby corrected as shown below:

Column 5, Claim 1, lines 9-11, delete "forming a first p+ type epitaxial layer on a heavily doped n+ type substrate of monocrystalline silicon;".

Claim 2, between lines 5 and 6 insert --growing a first n type epitaxial layer on a heavily doped n+ type substrate of monocrystalline silicon;--;

lines 11-13 delete "growing a first n type epitaxial layer on a heavily doped n+ type substrate of monocrystalline silicon;".

Column 6, line 3, after "second" insert --additional--;

Claim 3, line 14, delete, "inside said";

line 15, delete, "second p+ type region";

line 18, after "BMFET," insert --the first n+ type region being located inside said second p+ type region and--;

UNITED STATES PATENT AND TRADEMARK OFFICE
CERTIFICATE OF CORRECTION

PATENT NO. : 5,246,871

DATED : September 21, 1993

INVENTOR(S) : Raffaele ZAMBRANO et al.

It is certified that error appears in the above-identified patent and that said Letters Patent is hereby corrected as shown below:

line 26, change "second" to --first--.

Signed and Sealed this

Twenty-ninth Day of August, 2000

Attest:

Q. TODD DICKINSON

Attesting Officer

Director of Patents and Trademarks